US007034722B2

(12) United States Patent

Thomas

(10) Patent No.: US 7,034,722 B2

(45) Date of Patent: Apr. 25, 2006

(54) ADC CALIBRATION TO ACCOMMODATE TEMPERATURE VARIATION USING VERTICAL BLANKING INTERRUPTS

(75) Inventor: John Thomas, Santa Clara, CA (US)

(73) Assignee: Genesis Microchip Inc., Alviso, CA (US)

( * ) Notice: Subject to any disclaimer, the term of this patent is extended or adjusted under 35 U.S.C. 154(b) by 0 days.

(21) Appl. No.: 10/904,143

(22) Filed: Oct. 26, 2004

(65) Prior Publication Data

US 2006/0022858 A1 Feb. 2, 2006

Related U.S. Application Data

(60) Provisional application No. 60/592,836, filed on Jul. 29, 2004, provisional application No. 60/611,042, filed on Sep. 17, 2004.

(51) Int. Cl.
*H03M 1/10* (2006.01)
*H04N 17/00* (2006.01)
*H04N 17/02* (2006.01)

(52) U.S. Cl. ...................................... 341/120; 348/183

(58) Field of Classification Search ................ 341/120, 341/118, 144, 156; 348/183, 465, 501, 524, 348/572; 370/395.64; 375/240, 240.25
See application file for complete search history.

(56) References Cited

U.S. PATENT DOCUMENTS 2,515,613 A * 7/1950 Schoenfeld ................. 348/524
4,410,876 A * 10/1983 Sawagata .................... 348/572
4,803,552 A * 2/1989 Marin ........................ 348/501
4,849,759 A * 7/1989 Hughes ...................... 341/156
4,999,701 A * 3/1991 Cavallerano et al. .. 375/240.25
5,231,398 A * 7/1993 Topper ....................... 341/156
5,353,117 A * 10/1994 Holman et al. ............ 348/183
6,157,332 A * 12/2000 Frank et al. ................ 341/144
6,278,733 B1 * 8/2001 Bennett et al. ............ 375/240
6,414,960 B1 * 7/2002 Kuhn et al. ............ 370/395.64
6,806,910 B1 * 10/2004 Hebbalalu et al. .......... 348/465
6,924,755 B1 * 8/2005 Callanan et al. ............ 341/118

OTHER PUBLICATIONS

Leitch, "DPS-575 Digital Processing Synchronizer," Dec. 9, 2002.*

* cited by examiner

*Primary Examiner*—Patrick Wamsley
(74) *Attorney, Agent, or Firm*—Beyer Weaver & Thomas LLP

(57) ABSTRACT

In digital display circuitry, configured to display an image encoded in an analog display signal, the digital display circuitry includes analog-to-digital converter (ADC) circuitry to recover pixel data elements of the image. During vertical blanking intervals of the analog display signal, the ADC circuitry is calibrated. Outside the vertical blanking intervals, the ADC circuitry is used to convert information in the analog display signal into digital representations of the pixel data elements. For example, the calibrating may include determining more acceptable values for certain ones of the operational parameters of the ADC circuitry.

26 Claims, 3 Drawing Sheets

ADC CALIBRATION TO ACCOMMODATE TEMPERATURE VARIATION USING VERTICAL BLANKING INTERRUPTS

CROSS REFERENCE TO RELATED APPLICATIONS

This application claims priority under 35 USC 119(e) to the following provisional patent applications: 60/592,836, filed Jul. 29, 2004; and 60/611,042, filed on Sep. 17, 2004; which are incorporated by reference herein in their entirety.

BACKGROUND OF INVENTION

1. Technical Field

The invention relates to display devices. More specifically, the invention relates to calibration of analog to digital converters used in digital displays.

2. Background

FIG. 1 illustrates a broad schematic of an arrangement to generate images and to display the images in digital form. In particular, a host 102 (for example, a personal computer) generates an image in digital format. Digital to analog converter (DAC) circuitry 104 associated with the host 102 converts the digital image data generated by the host 102 into analog image data (typically, in RGB format) to be sent out over a connection 106 to digital display circuitry 108. Analog to digital converter (ADC) circuitry 110 associated with the digital display circuitry 108 converts the analog image data back into digital image data, which is then provided to a display 112 such as a liquid crystal (LCD). The operation of the digital display circuitry 108 is typically under the control of a processor (not shown) that is either "on-board" (or otherwise relatively tightly coupled to the circuitry of the digital display circuitry 108) or "off board" (or otherwise less tightly coupled to the circuitry of the digital display circuitry 108).

With particular respect to the ADC circuitry 110, variation in silicon process may result in internal offset voltages of the ADC circuitry 110 varying with temperature. As a result, when temperature varies, the RGB output data through the ADC circuitry 110 may show data drift.

The internal offset voltages depend on factors such as threshold voltage mismatch, overdrive voltage and transistor mismatches. The internal offset voltages are cancelled out depending on the values of OFFSET1 and OFFSET2 registers for each of the RGB colors, associated with the ADC circuitry 110. The OFFSET1 and OFFSET2 registers both have the same general effect, but the OFFSET1 register provides a relatively gross adjustment, while the OFFSET2 register provides a relatively finer adjustment. In one example, each one bit adjustment of the OFFSET1 register provides 1.7 bits of least significant bit (LSB) adjustment to the ADC circuitry 110 for a color channel, while each one bit adjustment of the OFFSET2 register provides 0.8 bits of LSB adjustment to the ADC circuitry 110 for the color channel. By appropriately setting the values in the OFFSET1 and OFFSET2 registers for each channel, the result is that the colors (RGB) will be balanced as a whole.

However, the terms in the equation for determining the offset values for the OFFSET1 and OFFSET2 registers have different temperature coefficients. It is thus difficult to predetermine how to vary these values with temperature change to achieve a perfect cancellation of these different temperature variations. Also, the temperature dependence varies with process, making it even more difficult to predetermine how to correlate the offset values to temperature.

Conventionally, offset values and gain values are initialized at the power up of the digital display circuitry 108 (including the ADC circuitry 110) and stored in a non-volatile RAM (NVRAM). Thus, color balance is achieved, at least initially. However, the output data from one or more channels of the ADC circuitry 110 may shift based on changes in operating conditions, such as changes in operating temperature.

It is thus desirable to respond to such changes in operating conditions and, in particular, to respond in a way that is not nominally visible to a typical viewer of images on the display 112.

SUMMARY OF INVENTION

In digital display circuitry, configured to display an image encoded in an analog display signal, the digital display circuitry includes analog-to-digital converter (ADC) circuitry to recover pixel data elements of the image. During vertical blanking intervals of the analog display signal, the ADC circuitry is calibrated. Outside the vertical blanking intervals, the ADC circuitry is used to convert information in the analog display signal into digital representations of the pixel data elements. For example, the calibrating may include determining more acceptable values for certain ones of the operational parameters of the ADC circuitry.

DETAILED DESCRIPTION

Figure 1:
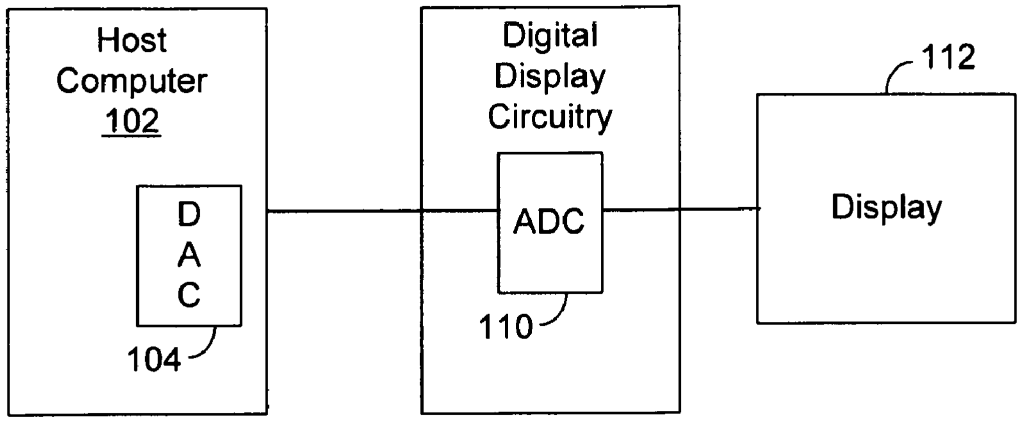
FIG. 1 (Prior Art)
FIG. 1 is a broad schematic illustration of circuitry to generate images and to display the images in digital form.

In general, a method is described to operate digital display circuitry such that the ADC circuitry 110 of the FIG. 1 digital display circuitry 108 is calibrated during vertical blanking intervals of the analog display signal sent over connection 106.

Figure 2:
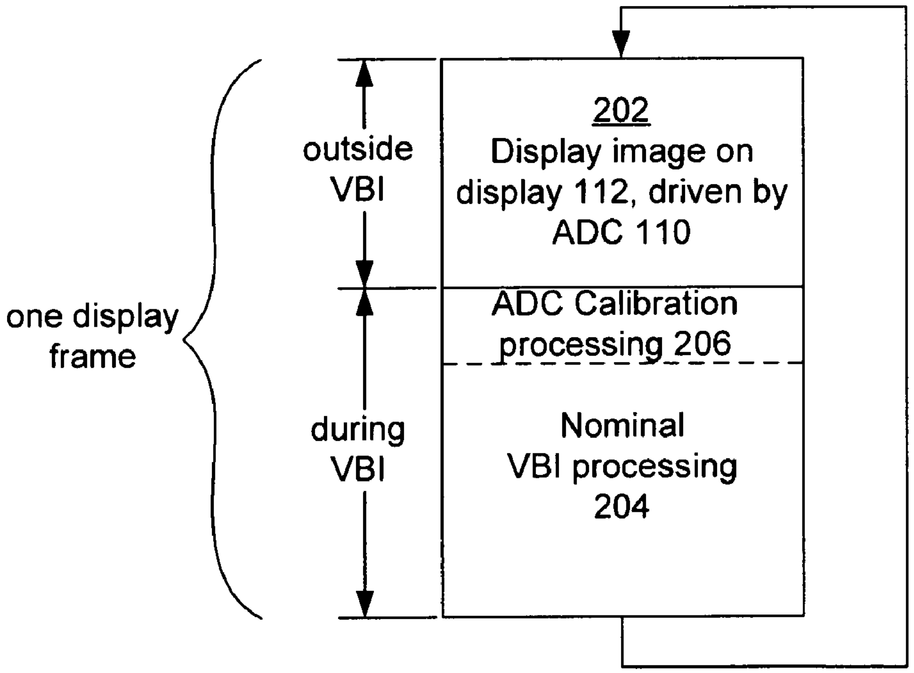
FIG. 2 broadly illustrates processing to operate the FIG. 1 circuitry to account for changes in operating conditions of the ADC circuitry 110.

For example, with reference to FIG. 2, it can be seen that step 202 (which is outside the vertical blanking interval, or VBI) includes processing to display an image on display 112. The step 202 processing may be entirely conventional. Steps 204 and 206 are during the VBI. At step 206, processing occurs to adjust the operation of the ADC circuitry 110 for changes in operating conditions. At step 204, nominal (e.g., conventional) VBI processing occurs. Thereafter, processing returns to step 202.

Figure 3:
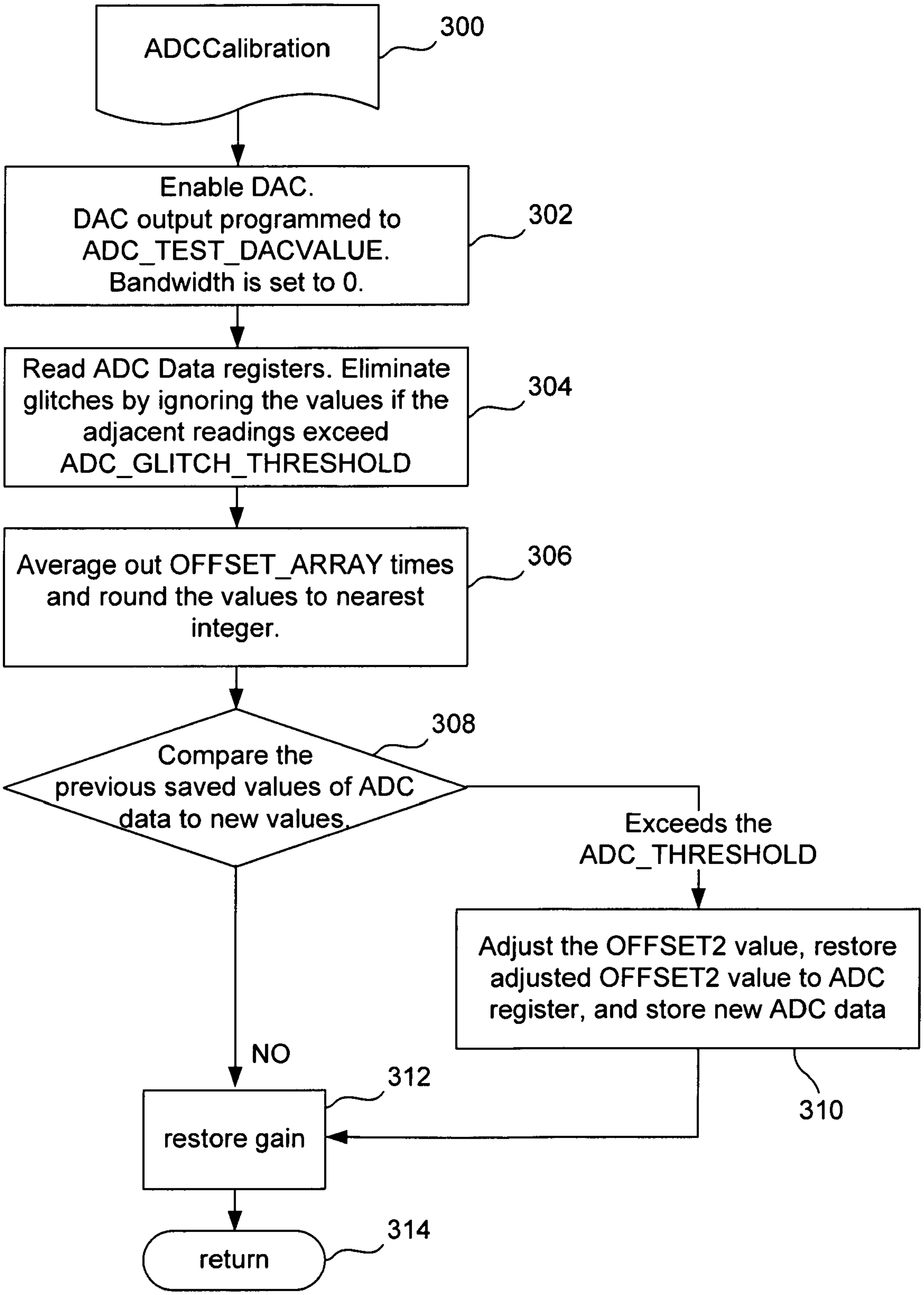
FIG. 3 is a flowchart illustrating initialization processing relative to the ADC calibration processing shown in FIG. 2.

FIG. 3 is a flowchart illustrating an example of the ADC calibration processing 206, using an internal DAC as input to the ADC circuitry 110. By using the internal DAC as input for the ADC circuitry 110 during calibration, extraneous influences can be minimized or eliminated. For example, interferences such as change of amplitude and external analog noise from the external ADC circuitry 110 inputs can be minimized or eliminated.

Turning now to FIG. 3, reference numeral 300 merely indicates an entry point into the FIG. 3 processing. At step 302, the internal DAC enabled as input to the ADC circuitry 110. The output of the internal DAC is programmed to ADC_TEST_DACVALUE (a user-programmable parameter to the processing). Also, the ADC circuitry 110 bandwidth is set to zero, which eliminates high frequency band interference.

At step 304, the ADC Data registers (output) are read. In the illustrated example, each ADC Data register is read multiple times. As discussed immediately below, this provides an opportunity for better ensuring the quality of the read ADC output data.

For example, in some examples, apparently aberrant output values of the ADC circuitry 110 are discarded. In a particular example, if values in adjacent (in time) readings of a particular ADC Data register differ by greater than ADC_GLITCH_THRESHOLD, then the values are not considered in the ADC calibration processing.

Furthermore, as shown at step 306, a moving average of the ADC output data is determined, and this moving average is used as input to the ADC calibration processing. By using the moving average, slow moving random noise exhibited in the ADC output data can be "averaged out." In a particular implementation of moving average processing, each ADC Data register is read OFFSET_ARRAY times, an average value is determined from the OFFSET_ARRAY read values, and then this average value is rounded to the nearest integer.

At step 308, the rounded, averaged value that is the result of step 306 is compared to a previously-saved result of step 306 (i.e., from a previous execution of the FIG. 3 ADC Calibration processing, in a previous VBI). If the difference between the current step 306 result and the previous step 306 result exceed ADC_THRESHOLD, then processing goes to step 310. At step 310, the new ADC data is saved and the OFFSET2 value is adjusted.

In one example, the processing at step 310 is such that the OFFSET2 value is adjusted only slightly (e.g., by one bit) each time the FIG. 3 processing is executed. In this example, if further adjusting of the OFFSET2 value is required to bring the ADC circuitry 110 to calibration, then the further adjusting would occur naturally as a result of subsequent executions of the FIG. 3 processing, on subsequent VBI's.

At step 312, the operational GAIN value is restored to the ADC circuitry 110 in place of the zero GAIN value used during FIG. 3 calibration processing. Then ADC calibration processing exits at step 314.

If the difference between the current step 306 result and the previous step 306 result do not exceed ADC_THRESHOLD, then the OFFSET2 value is not adjusted. Processing then continues at step 312 to restore the operational GAIN value, and the ADC calibration processing exits at step 314.

Figure 4:
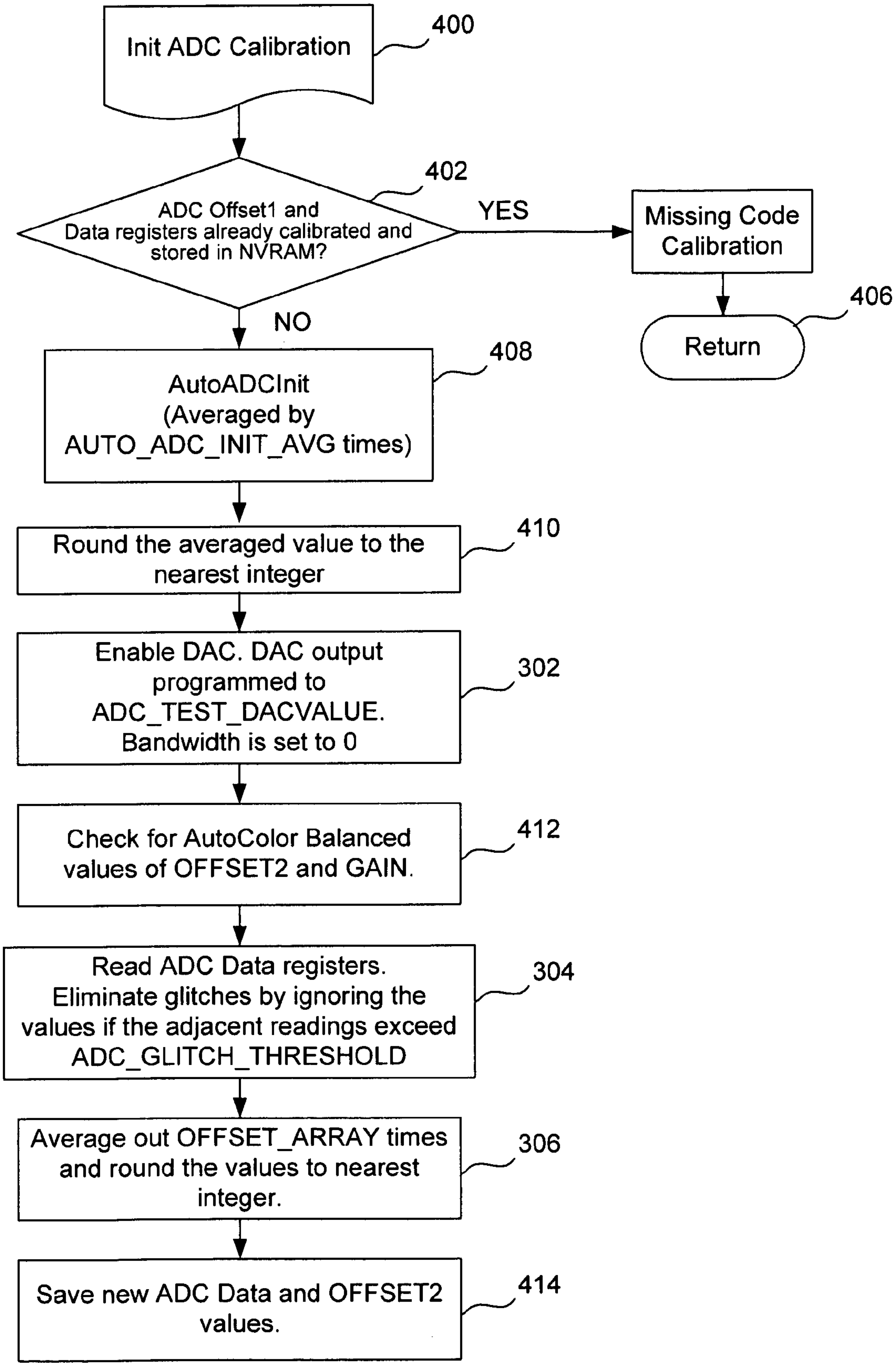
FIG. 4 is a flowchart illustrating the ADC calibration processing shown in FIG. 2.

We now turn to FIG. 4, which is a flowchart illustrating initialization processing for the ADC calibration of FIG. 3. Portions of the FIG. 4 processing are the same as processing of FIG. 3, and these same portions are denoted by identical reference numerals. The FIG. 4 processing is typically executed upon power up of the digital display circuitry 108, and may be executed at other times as appropriate, such as when called by an on-screen display setup function.

Reference numeral 400 merely indicates an entry point into the FIG. 4 processing. At step 402, it is determined whether the ADC circuitry 110 has been previously calibrated and the determined ADC OFFSET1 value has been stored into NVRAM. If so, then processing at step 404 executes to perform missing code calibration. Missing code calibration handles the case where there is an apparent discontinuity in the output function of the ADC circuitry 110.

For example, the ADC output function may be such that there are 255 different output digital codes, in steps of one, if the input is varied by one. Sometimes, due to internal ADC characteristics, there may not be a true one-to-one correspondence between the input and the output of the ADC circuitry 110. In missing code calibration, the input code at which the discontinuities occur are remembered, as well as the "fix" for the discontinuity. Then, in operation of the ADC circuitry 110, when such an input code is detected, the appropriate offset adjustments are made. For example, if an output code of sixty four was expected based on the input, and sixty five is seen at the output, then the next time an input code of sixty four is detected, one is subtracted from the output, to calibrate for the missing code.

If the ADC circuitry 110 has not been previously calibrated and the determined ADC OFFSET1 value stored into NVRAM, then processing at step 408 executes to calibrate the ADC circuitry 110 to determine a suitable OFFSET1 value. By performing the OFFSET1 calibration multiple times and averaging (i.e., referring to FIG. 4, AUTO_ADC_INIT_AVG times), there is a greater probability of minimizing the effect of glitches or other wrong values being recorded and stored into NVRAM. At step 410, the averaged OFFSET1 value is rounded to the nearest integer and stored into NVRAM.

At step 302 (like in FIG. 3), the DAC is enabled and programmed to output a desired test output value as input the ADC circuitry 110. At step 412, new OFFSET2 and GAIN values are calculated for each color channel of the ADC circuitry 110.

At step 304, the ADC data registers are read, accounting for the potential of glitches in the reading, as in the FIG. 3 processing. At step 306 the data values are averaged, as in the FIG. 3 processing. Finally, at step 414, the new ADC DATA and OFFSET2 values are stored, to be used as initial values in subsequent FIG. 3 processing during VBI intervals.

In accordance with some examples, there are events of higher priority than ADC calibration that should be service during VBI's. One such event is communication of data between the digital display circuitry 108 and the host device 102. When such events are detected, in some examples, ADC calibration is not performed for at least a predetermined number of consecutive VBI's. In one particular example, this is implemented by initializing a HOLDOFF counter upon detection of the higher priority event, decrementing the HOLDOFF counter at each VBI, and discontinuing ADC calibration processing during each consecutive VBI until a VBI in which the HOLDOFF counter has reached zero.

In addition, in some examples, the FIG. 3 processing will take more than the amount of time that is available for such processing during a VBI. In this case, the FIG. 3 processing is made re-entrant, e.g., by utilizing a timer interrupt to save the state of the FIG. 3 processing on an alternate stack between VBI's, and the FIG. 3 processing is carried out over multiple VBI's. It is determined during a particular VBI whether to initiate the calculating control processing of FIG. 3 or whether to continue executing a previously initiated calibrating control processing.

Using the timer interrupt, the amount of time during which the calibrating processing is executed during a particular VBI is limited, such that the calibrating processing is terminated and the state of FIG. 3 processing saved on the alternate stack upon occurrence of the timer interrupt.

What is claimed is:

1. In digital display circuitry, configured to display an image encoded in an analog display signal, the digital display circuitry including analog-to-digital converter (ADC) circuitry to recover pixel data elements of the image, a method comprising:

during vertical blanking intervals of the analog display signal, calibrating the ADC circuitry to account for changes in internal offset voltage of the ADC circuitry; and outside the vertical blanking intervals, using the ADC circuitry to convert information in the analog display signal into digital representations of the pixel data elements.

2. The method of claim 1, wherein:

the calibrating step includes determining more acceptable values for certain ones of the operational parameters of the ADC circuitry, wherein the certain ones of the operational parameters include adjustments to the internal offset voltages.

3. The method of claim 2, wherein the calibrating step includes:

providing a predetermined test input value to the ADC circuitry; and receiving at least one output value of the ADC circuitry for the test input value to the ADC circuitry and, based thereon, determining the move acceptable values for the certain ones of the operational parameters.

4. The method of claim 3, wherein:

determining the more acceptable operational parameters includes comparing the at least one output value of the ADC circuitry to an indication of previously-obtained output values of the ADC circuitry; and based on a result of the comparing, determining the more acceptable values for the certain one of the operational parameters.

5. The method of claim 4, wherein:

the at least one output value includes a plurality of output values for a same test input value;

the method further comprises determining a representative output value based on the plurality of output values; and in the comparing step, the representative output value is used to indicate the plurality of output values.

6. The method of claim 5, wherein:

determining the representative output value based on the plurality of output values includes determining an average of the plurality of output values.

7. The method of claim 6, wherein:

the step of determining the average of the plurality of output values includes:

first determining if any of the plurality of output values appear to be aberrant; and disregarding the aberrant values when determining the average.

8. The method of claim 7, wherein:

the step of determining if any of the plurality of output values appear to be aberrant includes, for each of the plurality of output values, comparing that one of the plurality of output values to at least one other of the plurality of output values; and determining that one of the plurality of output values is aberrant based on a result of the comparing step.

9. The method of claim 3, wherein:

while receiving the at least one output value, setting the values of operational parameters of the ADC circuitry, other than the certain ones of the operational parameters, to particular test operational values.

10. The method of claim 9, wherein the particular test operational values are the same for each step of providing the predetermined test input value to the ADC circuitry.

11. The method of claim 10, further comprising:

prior to receiving the at least one output value, changing the operational parameters of the ADC to the predetermined test values.

12. The method of claim 11, further comprising:

prior to nation of the vertical blanking interval, changing the operational parameters of the ADC to be other than the predetermined test values.

13. The method of claim 3, wherein:

the step of providing a predetermined test input value to the ADC circuitry includes:

enabling digital-to-analog converter (DAC) circuitry of the ADC circuitry;

causing the DAC circuitry to provide the predetermined test input value as an output of the DAC circuitry.

14. The method of claim 2, wherein:

determining the more acceptable values for the certain ones of the operational parameters includes determining values for which, if the certain ones of the operational parameters are adjusted thereto, the change in the image displayed by the digital display circuitry will be below a particular threshold.

15. The method of claim 14, further comprising:

initially determining the particular threshold.

16. The method of claim 15, wherein:

initially determining the particular threshold includes considering nominal properties of human vision.

17. The method of claim 1, wherein:

a single step of calibrating the ADC circuitry is executed in greater than one vertical blanking interval.

18. The method of claim 17, further comprising:

controlling the calibrating step to execute in greater than one vertical blanking interval.

19. The method of claim 18, wherein:

the step of controlling the calibrating step to execute in greater tan one vertical blanking interval includes, determining, at a particular vertical blanking interval, whether to initiate the calibrating controlling step or whether to continue executing a previously initiated calibrating controlling step.

20. The method of claim 1, further comprising:

during the vertical blanking intervals, limiting the time during which the calibrating step is executed.

21. The method of claim 20, wherein:

the step of limiting the time during which the calibrating step is executed during a particular vertical blanking interval is responsive to a timer interrupt.

22. The method of claim 21, wherein:

executing of a calibrating step is terminated dug a particular vertical blanking interval based on occurrence of the timer interrupt.

23. The method of claim 1, wherein:

based on an indication of higher priority processing, not executing processing of the calibrating step during particular vertical blanking intervals.

24. The method of claim 23, wherein:

the a number of vertical blanking intervals during which processing of the calibrating step is not executed is predetermined to be at least a particular number of consecutive vertical blanking intervals.

25. The method of claim 23, wherein:

the higher priority processing is communication of data between the digital display circuitry and a host device.

26. The method of claim 1, wherein:

a single step of calibrating the ADC circuitry is executed in one vertical blanking interval.

* * * * *

UNITED STATES PATENT AND TRADEMARK OFFICE

CERTIFICATE OF CORRECTION

PATENT NO. : 7,034,722 B2
APPLICATION NO. : 10/904143
DATED : April 25, 2006
INVENTOR(S) : John Thomas It is certified that error appears in the above-identified patent and that said Letters Patent is hereby corrected as shown below:

In the Claims:

In line 7 of claim 3 (column 5, line 24) change “move acceptable” to --more acceptable--.

In line 2 of claim 12 (coulmn 6, line 10) change “nation” to --termination--.

In line 3 of claim 19 (column 6, line 43) change “greater tan” to --greater than--.

In line 2 of claim 22 (column 6, line 57) change “dug” to --during--.

Signed and Sealed this

Ninth Day of January, 2007

Jon W. Dudas

JON W. DUDAS
*Director of the United States Patent and Trademark Office*